United States Patent [19]

Inamura

[11] Patent Number: 4,677,759
[45] Date of Patent: Jul. 7, 1987

[54] ROTARY DRIER APPARATUS FOR SEMICONDUCTOR WAFERS

[75] Inventor: Kazuhiko Inamura, Tokyo, Japan

[73] Assignee: Oki Electric Industry Co., Ltd., Minato, Japan

[21] Appl. No.: 883,696

[22] Filed: Jul. 8, 1986

[30] Foreign Application Priority Data

Jul. 8, 1985 [JP] Japan .............................. 60-148331

[51] Int. Cl.⁴ .............................................. F26B 17/32
[52] U.S. Cl. .............................................. 34/58; 34/8; 34/186
[58] Field of Search ....................... 34/8, 58, 184, 186, 34/187

[56] References Cited

U.S. PATENT DOCUMENTS

| | | | |
|---|---|---|---|
| 4,310,119 | 1/1982 | Culhane et al. | 34/58 |
| 4,313,266 | 2/1982 | Tam | 34/58 |
| 4,525,938 | 7/1985 | Aigo | 34/58 |

Primary Examiner—Larry I. Schwartz

[57] ABSTRACT

A rotary drier apparatus for drying semiconductor wafers within a vessel. The rotary drier apparatus has a turntable driven by a motor, support plates mounted on the turntable, cradles suspended pivotally from the support plates with the aid of a rotary shaft, and a stopper for stopping the cradles from touching each other in a nonrotating state. The centers of gravity of the cradles are located outwardly of a portion just under the pivotal axes of the cradles.

5 Claims, 5 Drawing Figures

ROTARY DRIER APPARATUS FOR SEMICONDUCTOR WAFERS

BACKGROUND OF THE INVENTION

1. Field of the Invention

The present invention relates to a rotary drier apparatus for drying rinsed semiconductor wafers.

2. Description of the Prior Art

A process of rinsing/drying semiconductor wafers has now conspicuously been improved in its throughput capacity owing to automation. It is the main method among many methods to effect the process described above to rinsing/drying carriers adapted to house 20 sheets of wafers therein in units carriers of two. A drier apparatus for use in such a process is of a type in which wafers are dried by rotation, wherein carriers serving to house the wafers are set interiorly of cradles mounted on a rotor, and any water adhering to the wafers is blown off by rotating the rotor. Such methods are for example described in Japanese Laid-Open Patent Publications No. 55-154736 and No. 56-8823.

A process of rotating and drying semiconductor wafers is adapted to keep the wafers horizontal and thereafter to allow a rotor to be rotated for easily removing waters. On the other hand, when the wafers are conveyed from one process to another, the wafers are supported vertically in their attitude in a carrier, and conveyed. Therefore, it is needed to alter the wafers from the vertical state to a horizontal one upon setting the carriers, including the wafers supported therein, on a rotary drier apparatus. A prior rotary drier apparatus for semiconductor wafers has a device to alter the attitude of a cradle to achieve the above object. The device comprises, for example a rod to push the cradle and an air cylinder to drive the rod.

However, such a prior rotary drier apparatus so equipped with the cradle attitude altering device suffers from some drawbacks that (a) hermetic sealing is insufficient at a connecting portion between a vessel and the attitude altering device, (b) cleanliness in the vessel is deteriorated since the attitude altering device goes in and out of the vessel in part, and (c) the construction of the rotary drier apparatus is complicated resulting in a large overall apparatus.

SUMMARY OF THE INVENTION

In view of the drawbacks of the prior rotary drier apparatus, it is an object of the present invention to provide a rotary drier apparatus for semiconductor wafers adapted to reduce the space required with a simple structure by profitably employing centrifugal force for altering the attitude of a cradle.

Another object of the present invention is to provide a rotary drier apparatus for semiconductor wafers having a vessel for rotating and drying wafers which is improved in cleanliness.

The present invention assures a positional relation between the center of gravity of the cradle (including a case which houses a carrier having a wafer mounted thereon) and a rotary shaft allowing the cradle to be suspended therefrom. According to the present invention, with a rotor not operated, the cradle is adapted to house/take out the carrier due to gravity. In addition, when the rotor is rotated, the cradle is swung externally due to centrifugal force, whereby the semiconductor wafer becomes substantially horizontal. With the rotary drier apparatus of the present invention, no means to alter the attitude of the cradle is required.

The above and other objects, features and advantages of the pesent invention will become more apparent from the following description when taken in conjunction with the accompanying drawings in which a preferred embodiment of the present invention is shown by way of illustrative example.

DESCRIPTION OF THE PREFERRED EMBODIMENT

An embodiment of a rotary drier apparatus for semiconductor wafers according to the present invention will be described with reference to FIGS. 1 to 5.

Figure 1:
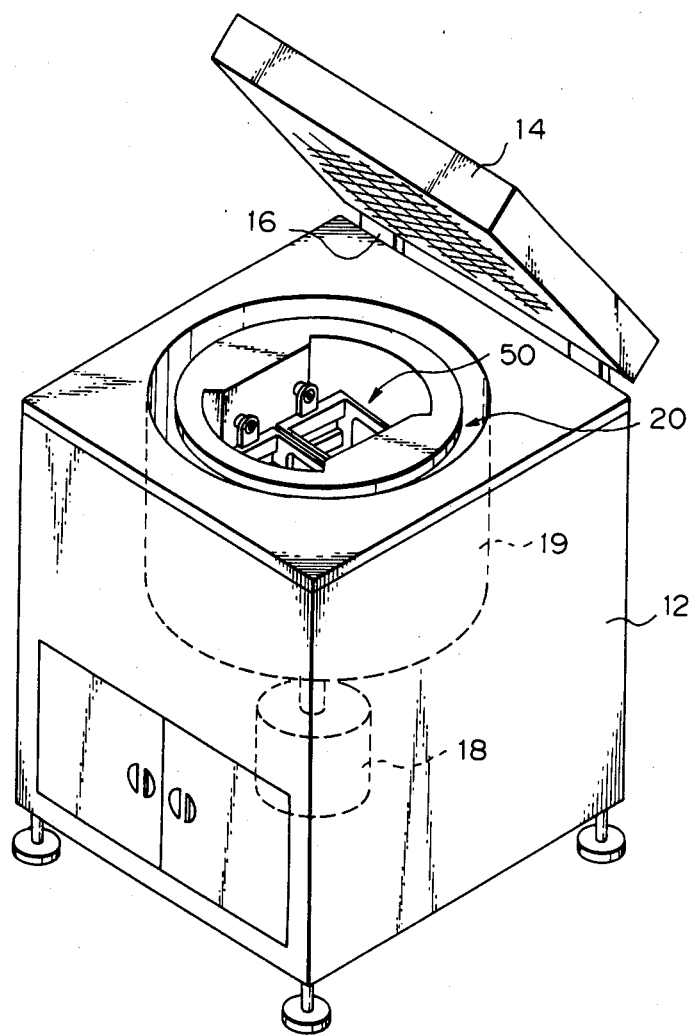
FIG. 1 is a perspective view illustrating an embodiment of a rotary drier apparatus for semiconductor wafer according to the present invention.

As shown in FIG. 1, the rotary drier apparatus has a housing 12, a cover 14, and a rotor 20. The cover 14 is mounted on one end of the housing 12 hinged thereon freely to be opened and closed. The rotor 20 provided interiorly to the housing 12 is coupled with a shaft of a motor 18 located downwardly of the rotor 20. A container 19 encircles the rotor 20 for receiving scattered water.

Figure 2:
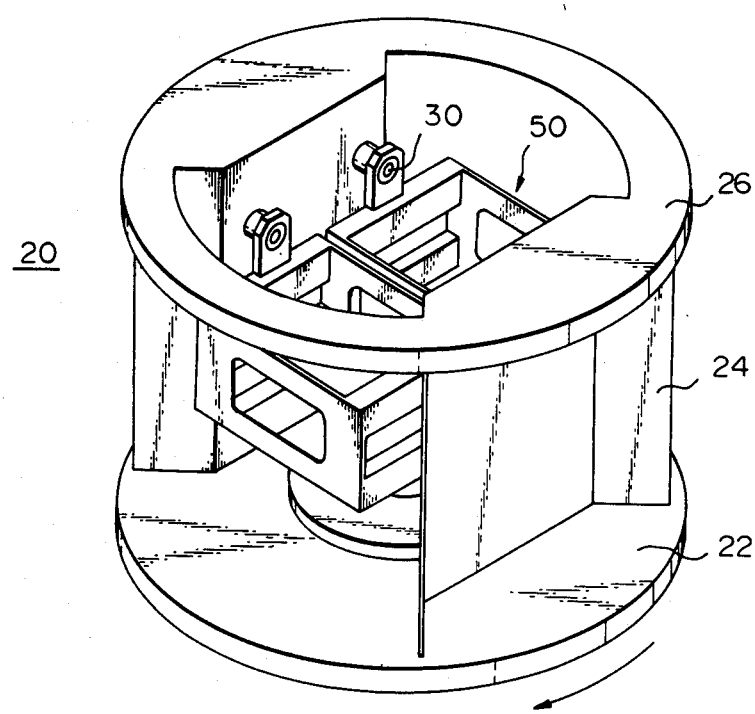
FIG. 2 is a perspective view illustrating a rotor shown in FIG. 1.

Referring to FIG. 2, the rotor 20 includes a turntable 22, support plates 24, and an upper plate 26, all being made of for example stainless steel, and being welded integrally with each other. The turntable 22 is connected with the shaft of the motor 18 at the center of the back surface thereof, and the shaft is rotated by means of the motor 18 in a direction of an arrow illustrated. The support plates 24 are mounted on the upper surface of the turntable 22 at positions where they confronted each other. The upper plate 26, annularly shaped, is joined with the upper end of each of the support plate 24. The support plates 24 respectively have two stainless rotary shafts 30 on each of surfaces of the support plates extending in parallel to each other. The rotary shafts are positioned in a confronting relation with each other, between which two cradles 50 for housing the carrier are suspended. These two cradles 50 are disposed at positions symmetrical with respect to the center of the turntable 22.

Figure 3:
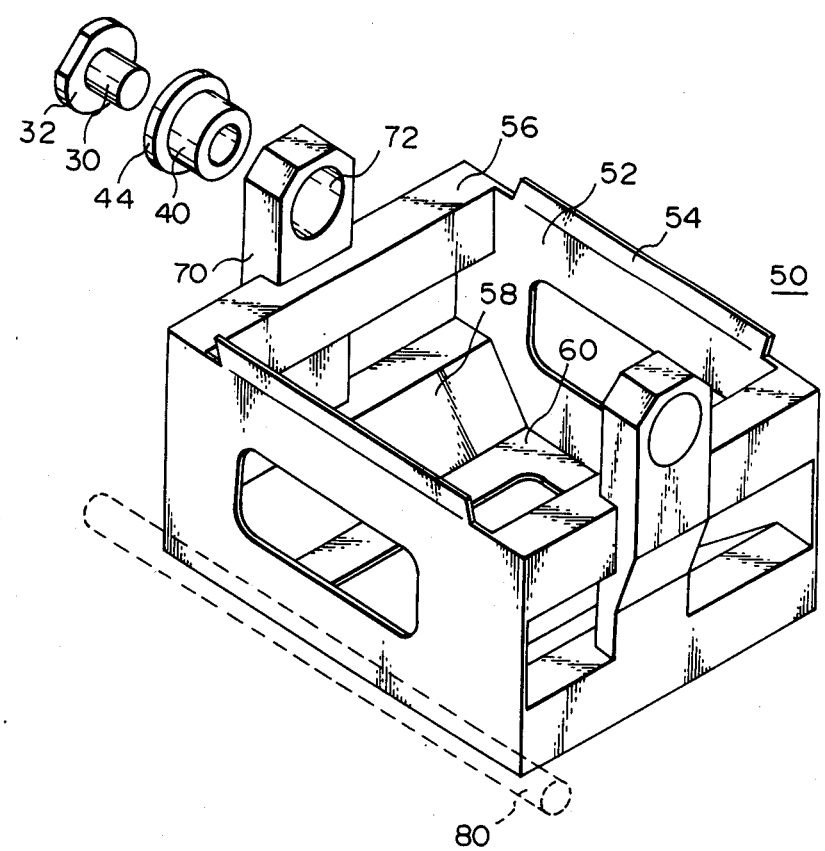
FIG. 3 is a perspective view of a cradle shown in FIG. 2.

As shown in FIG. 3, each of the cradles 50 has a parallel plate 52 made for example of stainless steel, square pipes 56, 58, a bottom plate 60, and blocks 70, all being joined with each other by welding. The bottom plate 60 is connected with the lower parts of the two parallel plates 52, while guides 54 are formed bent backwardly outwardly along the upper parts of the two parallel plates. The parallel plates 52 and the bottom plates 60 have central portions yielded by boring the above plates for allowing ventilating air to pass therethrough. Both sides of the parallel plates 52 are connected with each other via square pipes, in the present embodiment two sets of the square pipes 56, 58. Each of the blocks 70 is fixed to a respective square pipe 56 at a position where it faces the other block 70. Each block 70 has a round hole 72 penetrating it at the position located upwardly of the square pipe 56 to which it is fixed for allowing a respective rotary shaft 30 to pass through.

The block 70 is mounted displaced from the center of the square pipe 56 toward a center of rotation of the rotor 20 along the square pipe 56 longitudinally thereof. This is done to allow the center of gravity of the cradle 50 and the rotary shaft 30 serving to suspend the cradle 50 therefrom to have a specific positional relationship therebetween. Namely, it is the reason that upon supporting the cradle 50 in a state of the bottom plate 60 being mad horizontal, the center of gravity of the cradle 50 (and the carrier with semiconductor wafer housed therein) is to be positioned further externally of a portion just under the rotary shaft 30.

However, even if the mounting position of the block 70 is located at the center of the square pipe 56 with respect to a longitudinal direction of the square pipe 56, the center of gravity of the cradle 50 and the rotary shaft 30 are capable of having the above positional relationship. For example, a weight can be attached to the back surface of the bottom plate 60 on the side thereof separated away from the turntable.

The cradle 50 is suspended down from the support plate 24 after passing the rotary shaft 30 through the round hole 72, but the rotary shaft 30 and the round hole 72 cannot be fitted directly to each other because this would lead to the rubbing of stainless steels against each other and the production of fine powder which would exert a bad influence upon the quality of IC's to produced from the semiconductor wafers. To prevent the fine powder from being produced, a resin sleeve 40 is fitted in the round hole 72, and the rotary shaft 30 is set passing inwardly through the sleeve.

The sleeve 40 is formed with use for example of DAI-FLON (trademark of DUPON CO., LTD.). The sleeve 40 is further adapted to have an outer diameter greater by 0.05 mm than that of the round hole 72 so as to be fixed in the round hole 72. In addition, the sleeve 40 is adapted to have an inner diameter greater by a value not much exceeding 0.1 mm than that of the rotary shaft 30. One end of the sleeve 40 is made thicker than the other portions to form a flange 44. The rotary shaft 30 is adapted to be integrated with a base 32 serving to fix the rotary shaft 30 on the support plate 24, but the base 32 and the block 70 are prevented from making contact with each other owing to the flange 44 being interposed therebetween.

A stopper 80 is disposed between the two cradle opposite ends of stopper 80 are welded to the respective support plates 24. The stopper 80 is disposed at a position of supporting the cradle 50 in a state where the center of gravity of the cradle 50 is located outwardly of a position just under the rotary shaft.

Operation of the present invention will be described here with reference to FIGS. 4 and 5. Although like reference numbers are applied to the parts shown in FIGS. 1 to 3, the arrangement and configuration of the apparatus are simplified in FIGS. 4 and 5 to facilitate understanding.

Figure 4:
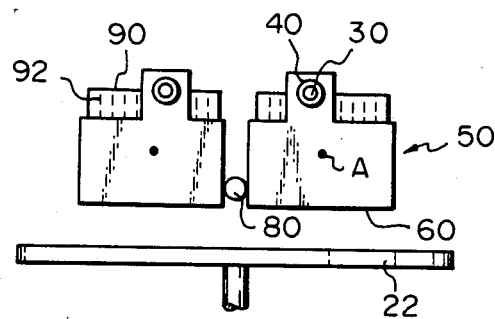
FIG. 4 is an inoperative view showing a state of the rotor of FIG. 2.
Figure 5:
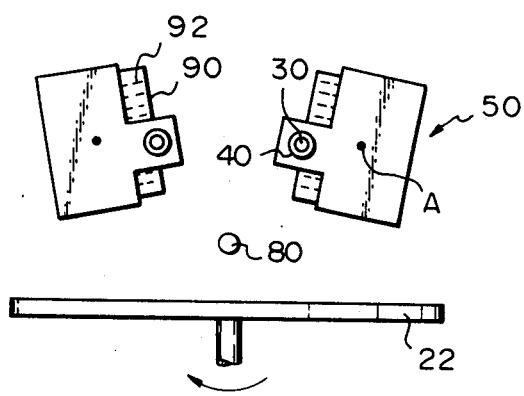
FIG. 5 is a view showing the rotor of FIG. 2 in rotation.

Referring to FIG. 4, the rotor 20 is not operating, and the cradle 50 has housed the carrier 90 including the semiconductor wafers 92 thereon. The center A of gravity of the cradle 50 to house the carrier 90 is located outwardly of a portion just under the rotary shaft 30. Due to such a positional relationship, the cradle 50, when the rotor 20 is not operated, is allowed to strike the stopper 80 by a component of gravity and is supported for making the bottom plate 60 horizontal. Although the position of the center of gravity A is slightly shifted after taking out the carrier 90 from the cradle 50, the positional relationship between the center of gravity A and the rotary shaft 30 are maintained as it is. With the cradle 50 so situated, the carrier 90 is housed or taken out.

After housing the carrier 90 including the wafer 92 mounted thereof in the cradle 50, the motor 18 is driven for rotating the rotor 20. The maximum speed of the rotor is 1000 rpm and the time required for the rotation ranges from 3 to 5 minutes. When the rotor 20 is rotated, the cradle 50 is swung outwardly owing to the centrifugal force. As shown in FIG. 5 illustrating this state, the semiconductor wafers 92 housed in the carrier 90 are kept substantially horizontal, and ordinary drying-up operation with rotation can be assured.

According to the present invention, as descirbed above, when the rotor is not operated, the cradle is in a state with the aid of gravity in which the carrier is housed therein and can be taken out thereof. In addition, with the rotor being rotated, the cradle is swung outwardly due to the centrifugal force for permitting the semiconductor wafers housed in the cradle to be made substantially horizontal. Accordingly, the rotary drier apparatus for semiconductor wafer of the present invention requires no means to alter the attitude of the cradle. In addition, (a) cleanliness in the vessel can be maintained, (b) the whole of the apparatus can be miniaturized and simplified compared prior ones; and (c) the time needed to dry any semiconductor wafers can be shortened.

Although in the above embodiment, the support plate 24 is adapted to have the rotary shaft 30 while the cradle 50 adapted to have the sleeve 40, the relationship may be reversed.

Although a certian preferred embodiment has been shown and described, it should be understood that many changes and modifications may be made therein without departing from the scope of the appended claims.

What is claimed is:

1. An apparatus for drying semiconductor wafers on wafer carriers by centrifugal force, said apparatus comprising:

a turntable;

a pair of cradles, each mounted adjacent to each other on said turntable for rotation therewith for removably carrying a wafer carrier therein;

means, including a motor and a shaft, for driving said turntable in rotation on said shaft;

a container housing said turntable at a lower position therein, said container having side walls for receiving splatterings from semiconductor wafers on the wafer carriers carried by the cradles when said turntable is rotated by said driving means, an upper opening through which the wafer carriers are vertically removable from said turntable and said container, and a bottom plate having a hole in a middle portion thereof, said shaft extending vertically upward through said hole from said motor to a middle portion of said turntable;

a pair of supporting members fixedly mounted on a surface of said turntable, horizontally spaced apart on opposite sides of said middle portion of said turntable, said cradles being disposed between and pivotably mounted to said supporting members on opposite sides of said middle portion of said turntable for pivotal movement about respective parallel horizontal axes extending between said supporting members, said cradles having respective centers of gravity spaced from said axes so as to provide a turning moment biasing the bottom ends of said cradles toward each other, such that rotation of said turntable pivots said cradles about said axes radially outward of said turntable by centrifugal force; and stopper means, disposed between said cradles so as to abut said cradles when said turntable is not rotating, for preventing said cradles from touching each other when said turntable is not rotating.

2. An apparatus as in claim 1, wherein said stopper means is a shaft crossing said turntable between said pair of support members.

3. An apparatus as in claim 1, wherein said turntable, said supporting members, and said cradles are formed of stainless steel.

4. An apparatus as in claim 3, wherein said cradles have side walls and are pivotally mounted to said supporting members by steel pins fixed to said supporting members and resin sleeve fixed in holes in said side walls of said cradles, said pins being pivotally mounted in said sleeves.

5. An apparatus as in claim 1, wherein said cradles have side walls and are pivotally mounted to said supporting members by pins fixed to said supporting members and resin sleeves fixed in holes in said cradles, said pins being pivotally mounted in said sleeves.

* * * * *